United States Patent
Winger et al.

(10) Patent No.: US 11,355,953 B2
(45) Date of Patent: Jun. 7, 2022

(54) WIRING PROGNOSTICS SYSTEM FOR VEHICLES

(71) Applicant: GM GLOBAL TECHNOLOGY OPERATIONS LLC, Detroit, MI (US)

(72) Inventors: Lyall K. Winger, Waterloo (CA); Brandon E. Pieniozek, Royal Oak, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 0 days.

(21) Appl. No.: 17/092,395

(22) Filed: Nov. 9, 2020

(65) Prior Publication Data

US 2022/0149650 A1    May 12, 2022

(51) Int. Cl.
*G01R 31/58*  (2020.01)
*G01R 31/00*  (2006.01)
*B60R 16/033*  (2006.01)
*H02J 9/06*  (2006.01)

(52) U.S. Cl.
CPC .............. *H02J 9/06* (2013.01); *B60R 16/033* (2013.01); *G01R 31/005* (2013.01); *G01R 31/58* (2020.01)

(58) Field of Classification Search
CPC ......... H02J 9/06; G01R 31/58; G01R 31/005; B60R 16/033
USPC ...................................................... 307/10.1
See application file for complete search history.

(56) References Cited

U.S. PATENT DOCUMENTS

| | | | |
|---|---|---|---|
| 5,936,318 A * | 8/1999 | Weiler ................. | H02J 9/00 307/66 |
| 8,395,391 B2 * | 3/2013 | Potter ................. | G01R 31/086 324/525 |
| 9,250,283 B2 * | 2/2016 | Johnson ............... | G01R 31/58 |
| 9,349,227 B2 | 5/2016 | Julson et al. | |
| 9,601,879 B1 | 3/2017 | Lin et al. | |
| 9,647,397 B2 | 5/2017 | Du et al. | |
| 9,678,847 B2 | 6/2017 | Du et al. | |
| 10,348,236 B2 | 7/2019 | Lin et al. | |
| 10,549,773 B2 | 2/2020 | Lin et al. | |
| 2011/0181295 A1 * | 7/2011 | Haugen ............... | G01R 31/11 324/543 |
| 2016/0149612 A1 * | 5/2016 | Julson ................. | H04L 12/403 375/224 |
| 2020/0023891 A1 | 1/2020 | Lin et al. | |
| 2020/0158772 A1 | 5/2020 | Du et al. | |

OTHER PUBLICATIONS

U.S. Appl. No. 16/601,043, filed Oct. 14, 2019, Lin et al.

* cited by examiner

*Primary Examiner* — Michael R. Fin

(57) ABSTRACT

A system for a vehicle includes a battery of the vehicle, a plurality of switches connected to the battery, and a plurality of subsystems of the vehicle connected to the battery via the switches and wires. The system includes a controller configured to control the switches and the subsystems, and to identify a variation in a rate of change of current characteristic in frequency domain for a current loop including one of the switches, one of the subsystems, and a plurality of the wires. The controller is configured to determine integrity of the plurality of the wires and connections of the wires in the current loop based on the variation in the rate of change of current characteristic for the current loop.

20 Claims, 13 Drawing Sheets

WIRING PROGNOSTICS SYSTEM FOR VEHICLES

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to a wiring prognostics system for vehicles.

A vehicle comprises many subsystems that include sensors and actuators that are operated by one or more batteries in the vehicle. Examples of the subsystems include a braking subsystem, a steering subsystem, a navigation subsystem, a communication subsystem, an infotainment subsystem, a safety subsystem, an autonomous subsystem, and so on. The subsystems are connected to and communicate via a Controller Area Network (CAN) bus in the vehicle.

The subsystems include components connected by wires (e.g., cables, wiring harnesses, etc.) and connectors. The wires and connectors can degrade over time due to various factors such as environmental and operating temperatures, vibration, and so on. As a result, the wires and connectors can develop problems including loose connections, open connections, short circuits, corroded contacts, and so on. These problems can cause inconveniences (e.g., the vehicle may fail to start) or jeopardize safety of occupants of the vehicle (e.g., a safety feature may fail to operate).

SUMMARY

A system for a vehicle comprises a battery of the vehicle, a plurality of switches connected to the battery, and a plurality of subsystems of the vehicle connected to the battery via the switches and wires. The system comprises a controller configured to control the switches and the subsystems, and to identify a variation in a rate of change of current characteristic in frequency domain for a current loop including one of the switches, one of the subsystems, and a plurality of the wires. The controller is configured to determine integrity of the plurality of the wires and connections of the wires in the current loop based on the variation in the rate of change of current characteristic for the current loop.

In another feature, the controller generates an indication regarding the integrity of the plurality of the wires and connections of the wires in the current loop in response to the integrity being less than or equal to a first threshold.

In another feature, the controller generates an indication regarding the integrity of the plurality of the wires and connections of the wires in the current loop in response to the integrity being less than or equal to a first threshold, and disconnects the one of the subsystems from the current loop by controlling the one of the switches in response to the integrity being less than or equal to a second threshold that is greater than the first threshold.

In another feature, the controller characterizes operation of the one of the subsystems based on the variation in the rate of change of current characteristic for the current loop and determines based on the characterization whether to disconnect the one of the subsystems from the current loop by controlling the one of the switches.

In another feature, the controller characterizes operation of the one of the subsystems based on the variation in the rate of change of current characteristic for the current loop, and based on the characterization controls the one of the switches to disconnect the one of the subsystems from the current loop and subsequently reconnect the one of the subsystems to the current loop.

In another feature, the controller characterizes the operation of the one of the subsystems and disconnects the one of the subsystems based on the characterization when the vehicle is turned off.

In another feature, based on the variation in the rate of change of current characteristic for the current loop, the controller disconnects the one of the subsystems from the current loop and activates a backup subsystem powered by the battery.

In another feature, based on the variation in the rate of change of current characteristic for the current loop, the controller disconnects the one of the subsystems from the current loop and activates a backup subsystem powered by a different battery.

In another feature, the controller determines the integrity of the plurality of the wires and connections of the wires additionally based on one or more of a voltage measurement and a temperature measurement in the current loop.

In another feature, the controller is configured to generate and store a set of histograms of rate of change of current characteristics measured at different operating temperatures for the plurality of subsystems, generate a histogram of the rate of change of current characteristic at an operating temperature for the one of the subsystems, compare the histogram to one of the histograms corresponding to the operating temperature, determine a difference between the histogram and the one of the histograms, determine the integrity of the plurality of the wires and connections of the wires in the current loop based on the difference, and generate an indication regarding the integrity of the plurality of the wires and connections of the wires in the current loop in response to the difference being greater than or equal to a predetermined threshold.

In still other features, a method comprises connecting a battery to a plurality of subsystems of a vehicle via a plurality of switches and wires, controlling the switches and the subsystems, and identifying a variation in a rate of change of current characteristic in frequency domain for a current loop including one of the switches, one of the subsystems, and a plurality of the wires. The method comprises determining an integrity of the plurality of the wires and connections of the wires in the current loop based on the variation in the rate of change of current characteristic for the current loop.

In another feature, the method further comprises detecting at least one of a defective wire and a defective connection of one of the wires in the current loop.

In another feature, the method further comprises generating an indication regarding the integrity of the plurality of the wires and connections of the wires in the current loop in response to the integrity being less than or equal to a first threshold, and disconnecting the one of the subsystems from the current loop by controlling the one of the switches in response to the integrity being less than or equal to a second threshold that is greater than the first threshold.

In another feature, the method further comprises characterizing operation of the one of the subsystems based on the variation in the rate of change of current characteristic for the current loop, and determining based on the characterization whether to disconnect the one of the subsystems from the current loop by controlling the one of the switches.

In another feature, the method further comprises characterizing operation of the one of the subsystems based on the variation in the rate of change of current characteristic for the current loop, and based on the characterization, controlling the one of the switches to disconnect the one of the subsystems from the current loop and subsequently reconnect the one of the subsystems to the current loop.

In another feature, the method further comprises characterizing the operation of the one of the subsystems when the vehicle is turned off, and disconnecting the one of the subsystems based on the characterization when the vehicle is turned off.

In another feature, the method further comprises based on the variation in the rate of change of current characteristic for the current loop, disconnecting the one of the subsystems from the current loop and activating a backup subsystem powered by the battery.

In another feature, the method further comprises based on the variation in the rate of change of current characteristic for the current loop, disconnecting the one of the subsystems from the current loop and activating a backup subsystem powered by a different battery.

In another feature, the method further comprises determining the integrity of the plurality of the wires and connections of the wires additionally based on one or more of a voltage measurement and a temperature measurement in the current loop.

In another feature, the method further comprises generating and storing a set of histograms of rate of change of current characteristics measured at different operating temperatures for the plurality of subsystems, generating a histogram of the rate of change of current characteristic at an operating temperature for the one of the subsystems, comparing the histogram to one of the histograms corresponding to the operating temperature, determining a difference between the histogram and the one of the histograms, determining the integrity of the plurality of the wires and connections of the wires in the current loop based on the difference, and generating an indication regarding the integrity of the plurality of the wires and connections of the wires in the current loop in response to the difference being greater than or equal to a predetermined threshold.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
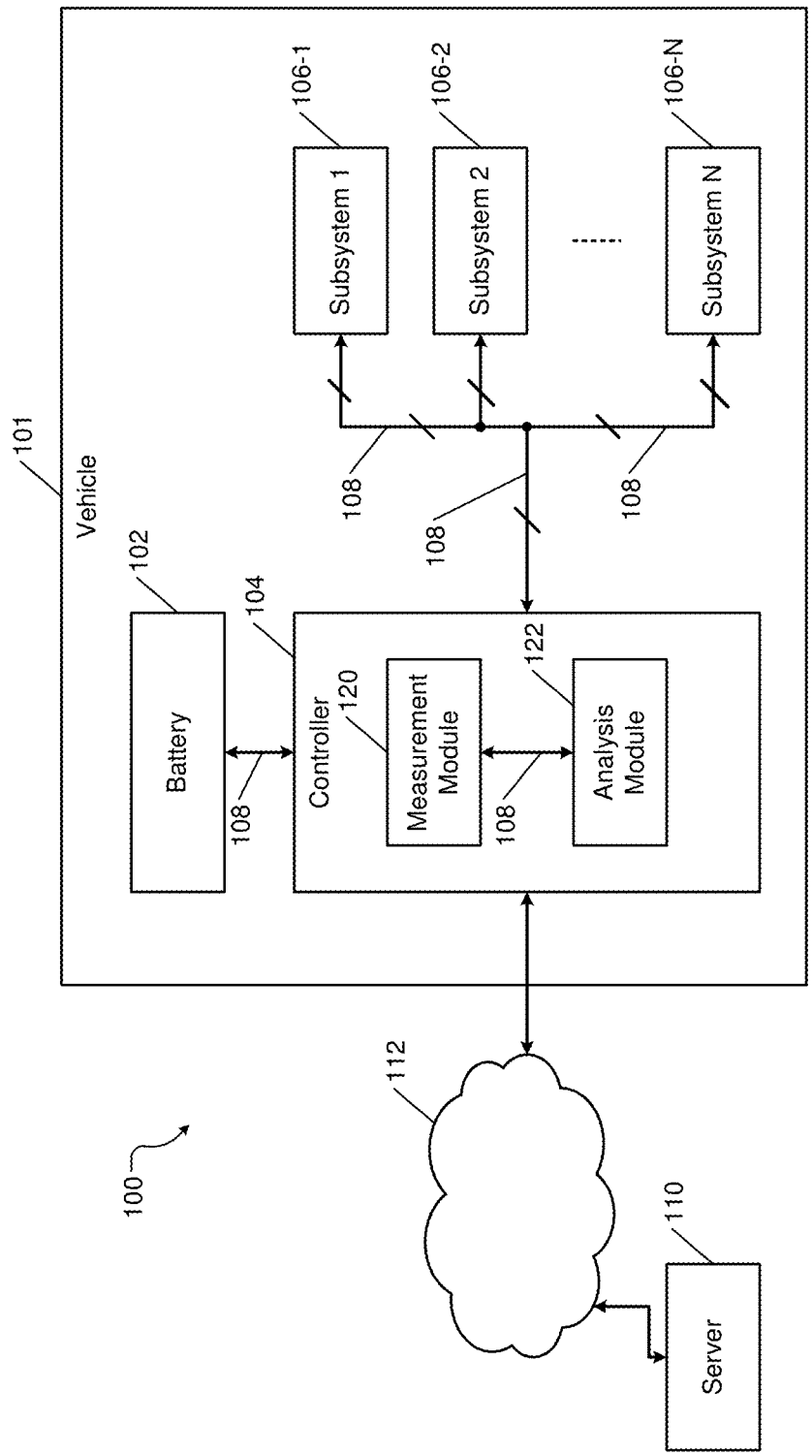
FIG. 1 shows an example of a wiring prognostics system for a vehicle according to the present disclosure.

Diagnostic methods such as time domain reflectometry (TDR) are typically used to diagnose wiring and connection problems in vehicles. However, these methods require additional hardware (e.g., diagnostic equipment such as a cable tester and associated wiring), which introduces additional failure points and yet cannot proactively perform prognostics by detecting degrading performance of the wiring and connections before a fault occurs. Moreover, measurements made using these methods are susceptible to electrical noise.

Some subsystems (e.g., subsystems controlling safety features) in the vehicle may be provided with redundancy capabilities (e.g., a backup subsystem, a redundant battery, etc.). However, providing redundancy capabilities increases cost. Further, although a backup subsystem for a primary subsystem is provided for redundancy, presently there is no way to automatically switch operation to the backup subsystem by proactively detecting a problem with the primary subsystem before the primary subsystem fails. Such proactive problem detection and subsequent automatic switching to backup (i.e., redundant) subsystems can be useful in autonomous vehicles.

In addition, presently there is no way to provide a hardware reset (i.e., disconnecting and reconnecting power) to a subsystem in the vehicle if the subsystem is misbehaving (e.g., draining battery, not responding, having communication issues, etc.). Presently there is also no way to detect a subsystem that is draining battery while the vehicle is turned off and to disconnect the subsystem while the vehicle is turned off. Furthermore, presently there is no way to verify integrity of the wiring and the connections in a vehicle before shipping the vehicle from the factory or before returning the vehicle to the customer after the vehicle is serviced at a service center.

The present disclosure provides a prognostics system that provides all of the above capabilities. The prognostics system characterizes impedances of the wiring and the connections used in various subsystems in the vehicle without using any additional equipment. The prognostics system detects degrading performance of the wiring and the connections before a fault occurs. The impedance characterization is carried out by analysing rate of change of current (di/dt) data from various nodes (i.e., connection points) in the wiring in frequency domain. Unlike the conventional resistance measurements performed by measuring voltage and current in time domain that are susceptible to noise, the analysis of the di/dt data in the frequency domain is largely unaffected by the noise due to noise filtering built into the analysis process in the frequency domain. Further, by increasing sampling frequency, the analysis of the di/dt data in the frequency domain can be used to detect wiring abnormalities at a higher resolution than when the data is analyzed in time domain. The ability to proactively identify abnormalities reduces the need to provide redundancies for many systems in the vehicles, which saves cost.

Additionally, instead of using conventional wire fuses, the prognostics system uses active switches (e.g., FET's) that can not only operate as fuses but can also be individually controlled to perform some of the operations that are presently not possible (e.g., isolating a misbehaving subsystem, automatically switching operation to a backup subsystem, providing hardware resets to subsystems, disconnecting a subsystem while the vehicle is turned off, etc.). The present disclosure is not limited to active switches. Instead, relays could be used. Further, the prognostics system can also work with fuses except that no mitigating or corrective actions can be performed. Further, the prognostics system can be used in the factory to verify the wiring and the connections of the subsystems in vehicles before shipping the vehicles. The prognostics system can also be used at service centers to verify the wiring and the connections after servicing vehicles before returning the vehicles to customers. These and other features of the prognostics system are described below in detail.

Specifically, presently, vehicles have a limited capability to self-diagnose compromised power delivery systems resulting from improperly torqued connections, loose and/or corroded connections, and damaged wires prior to permanent failure. Providing the ability to identify degraded performance of the wires and the connections and to notify customers prior to failure can improve safety and customer satisfaction. The prognostics system of the present disclosure can proactively detect these problems. The prognostics system provides an ability to characterize and measure changes in impedance of the power delivery systems using frequency domain analysis of di/dt data collected from the power delivery systems.

Many diagnostic systems may not detect problems associated with wiring and the connections in vehicles. The prognostics system of the present disclosure solves the following problems associated with these diagnostics systems: inability to detect wiring and connection performance degradation, requirement for more than one battery in active safety systems, limited safety performance in autonomous systems, and inability to force load shedding and isolation of subsystems during failure modes to prioritize safety.

The prognostics system of the present disclosure detects wiring connection degradation in vehicles for wiring prognostics without requiring additional external test equipment. The prognostics system can monitor and set wiring fault detection thresholds using empirical testing and calibrations performed based on the empirical testing. The prognostics system provides a built-in self-test of wiring systems that can be used in the factory before shipping vehicles and at service facilities before returning vehicles to customers after service. The prognostics system allows use of a single battery system for active safety feature support and provides enhanced system reliability.

More specifically, the prognostics system identifies changes in di/dt characteristics of a subsystem in frequency domain to characterize changes in behavior of the subsystem and to analyze changes in impedance over a current loop comprising the subsystem and associated wiring and connections. The prognostics system identifies performance degradation in the wiring and the connections based on the changes in impedance. The prognostics system sets wiring diagnostic threshold levels based on the di/dt analysis performed in the frequency domain since a discernable change cannot be identified over the noise floor when voltage, current, or power are analyzed in the time domain. In the frequency domain, the di/dt rates decrease as connections become loose or otherwise degrade (e.g., due to corrosion, vibration, etc.), which allows the prognostics system to detect minute problems such as when a nut is loose by as little as a quarter turn, for example. The detection resolution can be increased even further (e.g., to an eighth of a turn and so on) by increasing the sampling frequency.

The prognostics system provides compensation for wiring diagnostics over vehicle operating conditions. The prognostics system identifies changes in wiring and connection integrity more easily than alternative methods and with less sensitivity to noise associated with analog measurements. The prognostics system notifies a vehicle occupant to pull over or arrange service when a di/dt frequency profile of a subsystem shifts outside expected operating conditions. The prognostics system can automatically take appropriate mitigation actions based on the level of performance degradation to ensure safe vehicle operation under degraded performance.

The prognostics system provides many advantages. For example, the prognostics system can proactively detect wiring and performance issues before the issues become problems and require service. The prognostics system provides improved diagnostic ability by detecting abnormal heating of wiring, providing soft-short protection, providing faster short circuit detection, and detecting misbehaving subsystems. The prognostics system improves power distribution controls by allowing reduced wire sizes, providing improved under-voltage detection, detecting and eliminating (e.g., disconnecting) high-drain systems that drain the vehicle battery, resetting misbehaving systems, and providing redundant power fail-over.

Further, the prognostics system provides the ability to perform a comprehensive end-of-line test before shipping vehicles from the factory. The prognostics system identifies issues for users during use of the vehicles. The prognostics system allows service personnel to detect issues after service is completed before releasing the vehicles to users. Furthermore, the data from the prognostics system can be collected and analyzed at back end (e.g., in cloud) to improve future design of vehicle systems. These and other features of the system are now described below in detail.

The present disclosure is organized as follows. The prognostics system according to the present disclosure is shown and described with reference to FIGS. 1-7. The calibration, measurements, analyses, and mitigation performed by the prognostics system are described in detail with reference to FIGS. 8-18.

FIG. 1 shows a prognostics system 100 for a vehicle 101 according to the present disclosure. The prognostics system 100 comprises a battery 102, a controller 104, and a plurality of subsystems 106-1, 106-2, . . . , and 106-N (collectively subsystems 106) of the vehicle 101, where N is a positive integer. The battery 102 supplies power to the controller 104 and the subsystems 106. The controller 104 controls the subsystems 106.

Examples of the subsystems 106 include a braking subsystem, a steering subsystem, a navigation subsystem, a communication subsystem, an infotainment subsystem, an autonomous subsystem, and so on. Some of the subsystems 106 may control one or more safety features of the vehicle 101 and are called safety subsystems throughout the present disclosure.

The subsystems 106 are connected to the controller 104 and the battery 102 via a plurality of switches that also function as fuses (shown in FIGS. 2 and 3) and by a plurality of wires 108 (e.g., cables, wiring harnesses, etc.) and connectors (not shown). Some of the subsystems 106 may include components (e.g., sensors, actuators, etc.) that are connected to the controller 104 and the battery 102 by one or more of the wires 108 and connectors.

The controller 104 comprises a measurement module 120 and an analysis module 122. The measurement module 120 measures di/dt data in various current loops formed by the wires 108 and the subsystems 106. The analysis module 122 analyzes the di/dt data and detects abnormalities in the wires 108 and the subsystems 106 as described below in detail.

The controller 104 communicates with a remote server 110 via a distributed communications system 112 such as the Internet. The controller 104 can be implemented in many ways. For example, the controller 104 may be implemented in a battery management system of the vehicle (not shown). Some of the operations of the controller 104 described below may be offloaded to and performed by the server 110 in a cloud.

The controller 104 performs various operations as described below in detail. Briefly, the measurement module 120 measures the di/dt data across the switches, at various connectors, through the wires 108, and so on. The analysis module 122 processes and analyses the di/dt data to assess the integrity or level of degradation in performance of the wiring and the connections. The integrity of the wiring and the connections is inversely proportional to the level of degradation in performance of the wiring and the connections. Based on the analysis, the controller 104 determines whether the degradation requires immediate action (e.g., switching operation to a redundant subsystem, disabling a subsystem, stopping the vehicle, scheduling service, etc.). A calibration procedure performed by the controller 104 for the prognostics system 100, the analysis of the di/dt data performed by the controller 104 using the calibration data as a reference, and various mitigation operations performed by the controller 104 based on the analysis are described below in detail with reference to flowcharts shown in FIGS. 8-18.

Figure 2:
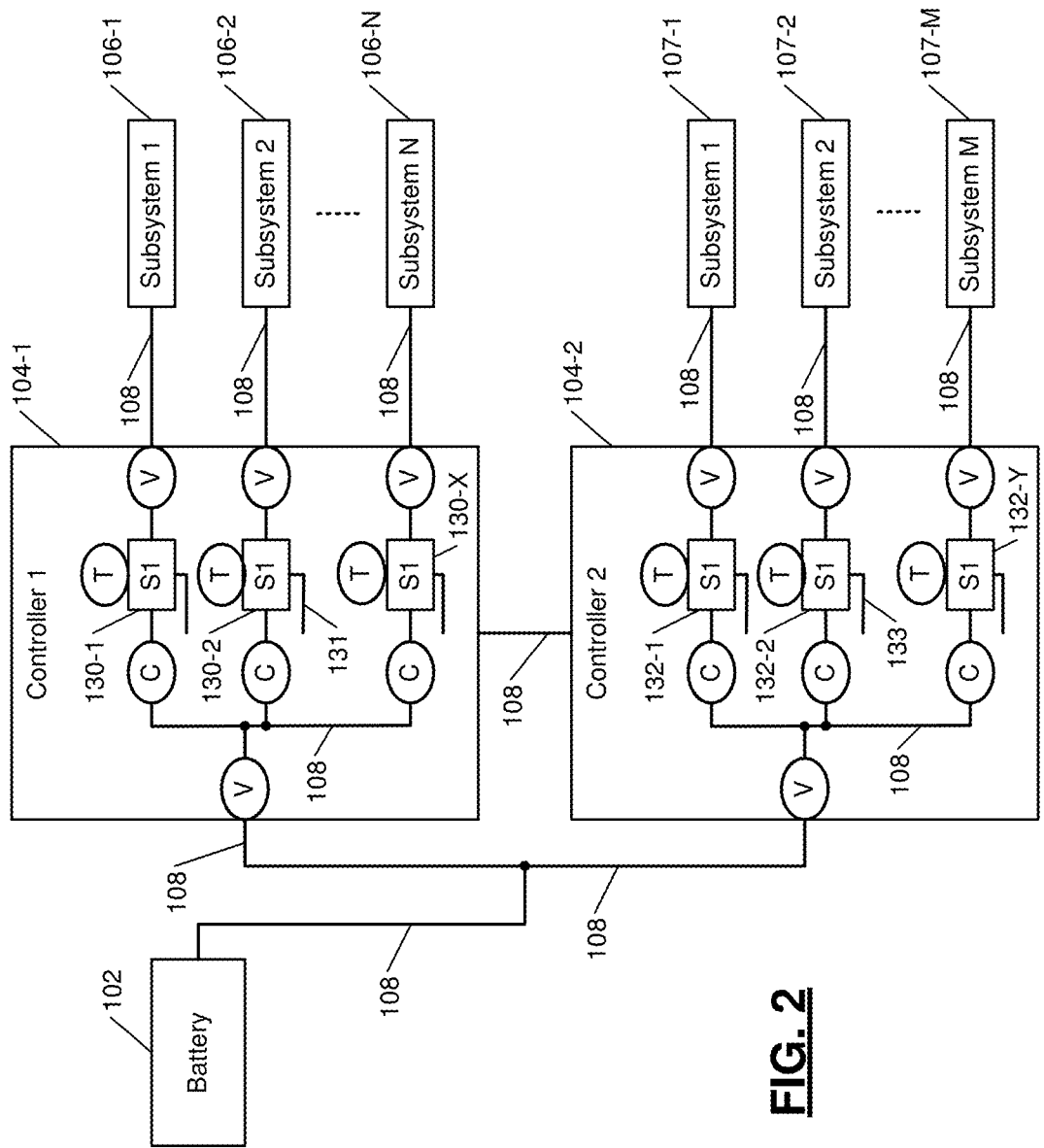
FIG. 2 shows an example of the wiring prognostics system for a vehicle including redundant subsystems and a single battery.

FIG. 2 shows an example of the prognostics system 100 that has the ability to isolate misbehaving subsystems to prevent power loss and to provide redundant power to safety subsystems using the single battery 102. For example, the controller 104 may be subdivided into a first controller 104-1 and a second controller 104-2 (collectively the controller 104). The first controller 104-1 may primarily control the subsystems 106. For redundancy, some of the subsystems 106 (e.g., safety subsystems) may be provided with backup subsystems 107-1, 107-2, . . . , and 107-M (collectively the backup subsystems 107), where M is a positive integer. The second controller 104-2 may communicate with the first controller 104-1 and may control the backup subsystems 107. Diagnostics may be implemented in a battery management system, or diagnostic decisions may be made in a host controller, cloud etc.

The first controller 104-1 performs prognostics to predict wiring faults and proactively service the subsystems 106 (e.g., by providing resets, isolating, switching to backup subsystems, etc.) using one or more methods described below in detail with reference to FIGS. 8-18. The single battery 102 is also diagnosable so as to reliably provide power to active safety subsystems (primary and backup) 106, 107.

The first controller 104-1 controls the subsystems 106 via switches 130-1, 130-2, . . . , and 130-X (collectively the switches 130), where X is a positive integer. The switches 130 operate as smart fuses. For example, the switches 130 can include FETs or some other active semiconductor devices that include a control terminal (e.g., a gate, an example shown at 131). The first controller 104-1 controls the states of the switches 130 by driving the control terminals of the switches 130. By controlling the control terminals of the switches 130, the switches 130 can be individually opened and closed, which allows the first controller 104-1 to individually connect and disconnect the subsystems 106. For example, the switches 130 provide the ability to individually connect and disconnect the subsystems 106 to and from the battery 102. The switches 130 also operate as fuses, which eliminates the need for wire fuses that cannot be controlled similar to the switches 130 and that do not allow the first controller 104-1 to individually connect and disconnect the subsystems 106.

The second controller 104-2 controls the backup subsystems 107 via switches 132-1, 132-2, . . . , and 132-Y (collectively the switches 132), where Y is a positive integer. The switches 132 also operate as smart fuses. For example, the switches 132 can include FETs or some other active semiconductor devices that include a control terminal (e.g., a gate, an example shown at 133). The second controller 104-2 controls the states of the switches 132 by driving the control terminals of the switches 132. By controlling the control terminals of the switches 132, the switches 132 can be individually opened and closed, which allows the second controller 104-2 to individually connect and disconnect the backup subsystems 107 based on signals received from the first controller 104-1.

For example, the switches 132 provide the ability to individually connect and disconnect the backup subsystems 107 to and from the battery 102 based on the signals received by the second controller 104-2 from the first controller 104-1. The switches 1322 also operate as fuses, which eliminates the need for wire fuses that cannot be controlled similar to the switches 132 and that do not allow the second controller 104-2 to individually connect and disconnect the backup subsystems 107 based on signals received from the first controller 104-1.

For example, the first controller 104-1 may identify a problem with one of the subsystems 106 by analyzing the di/dt data using one of many methods shown and described below with reference to FIGS. 8-18. The first controller 104-1 may isolate a misbehaving subsystem 106. The first controller 104-1 may disconnect the misbehaving subsystem 106 by controlling the corresponding switch 130. The first controller 104-1 may send a signal to the second controller 104-2 indicating that the misbehaving subsystem 106 is disconnected and that a corresponding backup subsystem 107 needs to be activated and connected instead.

Upon receiving the signal from the first controller 104-1 indicating that the misbehaving subsystem 106 is disconnected and that a corresponding backup subsystem 107 needs to be activated and connected instead, the second controller 104-2 activates a switch 132 corresponding to the backup subsystem 107 for the disconnected misbehaving subsystem 106 and connects the backup subsystem 107 instead of the disconnected misbehaving subsystem 106.

In addition to the switches 130, 132, the first and second controllers 104-1, 104-2 (collectively the controller 104) include temperature, current, and voltage sensors respectively shown as T, C, and V. These sensors are explained in further detail below with reference to FIG. 4.

Since the switches 130, 132 are not mere wire fuses and since the switches 130, 132 have control terminals 131, 133, the switches 130,132 are also diagnosable. Due to the control terminals 131, 133, the switches 130, 132 can be individually controlled and also can be controlled together (i.e., collectively) by driving their control terminals 131, 133 using a single signal from the controller 104. Further, all the switches 130, 132 can be opened and closed individually as well as together. Furthermore, fusing values for the switches 130, 132 can be calibrated at factory or in vehicle to minimize skews.

Figure 3:
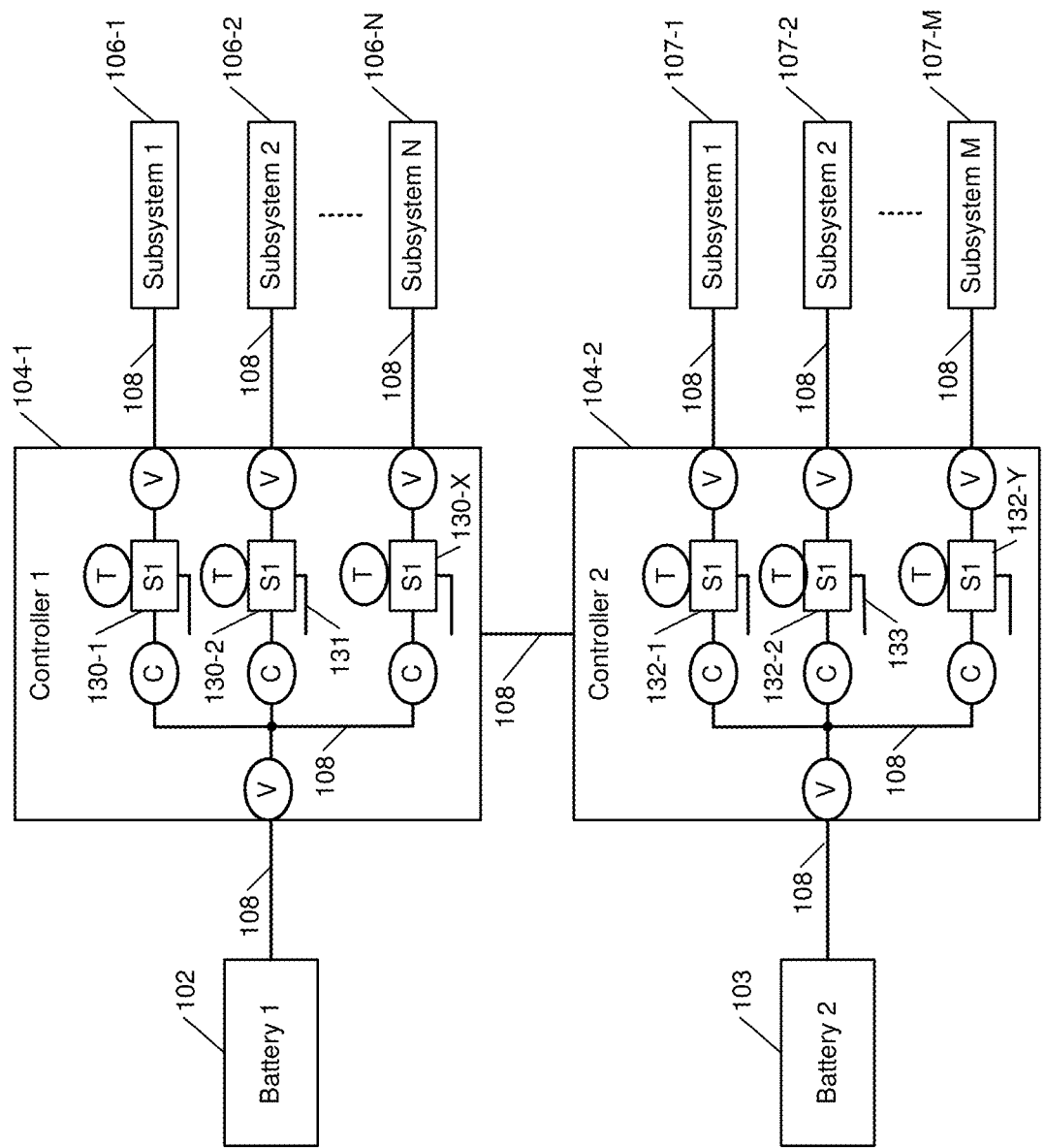
FIG. 3 shows an example of the wiring prognostics system for a vehicle including redundant subsystems and a redundant battery.

FIG. 3 shows the configuration of FIG. 2 with the addition of a redundant (i.e., backup) battery 103. The redundant battery 103 is also diagnosable. The redundant battery 103 provides a higher level of safety than in FIG. 2 since the redundant battery 103 can continue to supply power to a backup subsystem 107 if the battery 102 fails instead of a corresponding primary subsystem 106 failing.

Figure 4:
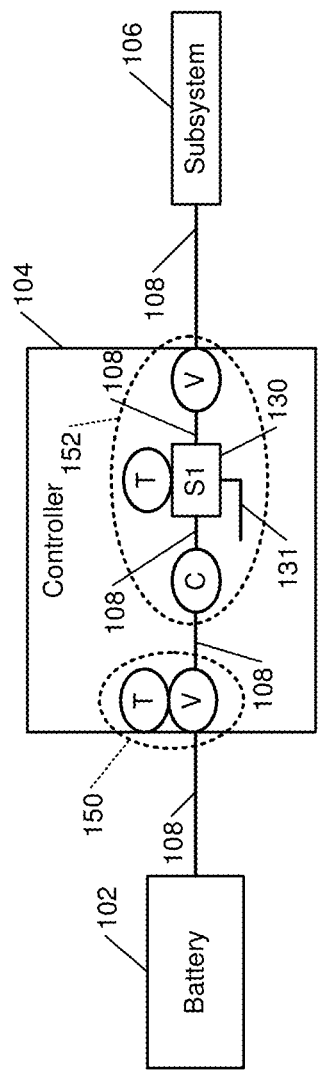
FIG. 4 shows a portion of the wiring prognostics system including temperature, current, and voltage sensors.

FIG. 4 shows a portion of the controller 104 with the temperature, current, and voltage sensors (shown in dotted ovals numbered 150 and 152) distributed in an example of a current loop including the battery 102, the switch 130, and the subsystem 106. Using the sensors 150, 152, the controller 104 compares the power to a temperature of the connection points at the sensor locations 150, 152 to identify risk of overheating due to a problem such as defective or degrading wiring 108 or connection (e.g., loose contact or corroding contact). Using the sensors 152, the controller 104 can identify which fuse is blown (i.e., which switch 130, 132 is defective) to the vehicle owner and schedule service.

Using the sensors 152, the controller 104 can identify the current loop consuming abnormally high amount of current during key off (i.e., when the vehicle is turned off), disconnect the subsystem 106 by controlling the switch 130 in the current loop, and prevent the battery 102 from draining, as explained below in detail with reference to FIGS. 15 and 16.

Using the sensors 152, the controller can also perform overcurrent and soft short circuit detection. For example, a soft short circuit may occur when ambient temperature is extremely low but may disappear after the temperature rises (e.g., during operation of the vehicle). The controller 104 can detect a soft short circuit by setting current versus time threshold and minimum voltage versus time threshold. If an overcurrent condition or a soft short circuit is detected, the controller 104 can employ a soft reset for mitigation and recovery.

Figure 5:
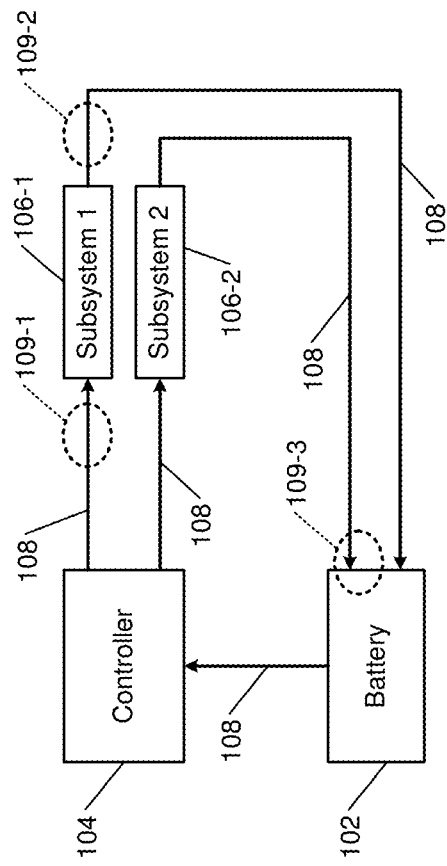
FIG. 5 shows an example of a current loop including wires and connectors diagnosed by the wiring prognostics system.

FIG. 5 shows examples of wiring problems that can be detected by the controller 104 in a current loop. For example, at 109-1, a connection may be bad due to a poorly crimped wire 108; at 109-2, a wire 108 may be defective because of a few strands of the wire 108 being cut; at 109-3, a connection may be bad because of a nut being loose, a crimp being bad, or contact being corroded; and so on.

The di/dt analysis of the data collected in the current loop (explained below in further detail with reference to FIGS. 6 and 7) provides an end-to-end analysis of the integrity of the wiring 108 and the connections in the current loop. The controller 104 analyzes the di/dt data in frequency domain and checks all connections in the current loop. As seen from FIGS. 6 and 7, contrary to time domain analysis, the analysis in frequency domain can be performed with low noise sensitivity and at a higher resolution than in time domain.

Based on the analysis of the di/dt data in frequency domain, the controller 104 characterizes the impedance of the wiring 108 and the connections in the current loop. The controller 104 detects degrading performance of the wiring 108 and the connections (e.g., detects problems shown as 109-1, 109-2, 109-3, etc.) before a fault occurs. The controller 104 performs the impedance characterization by analysing the di/dt data from various nodes (i.e., connection points) in the wiring 108 in frequency domain.

Unlike the conventional resistance measurements performed by measuring voltage and current in time domain that are susceptible to noise, the analysis of the di/dt data in the frequency domain is largely unaffected by the noise due to noise filtering built into the analysis in the frequency domain. Further, by increasing the sampling frequency, the analysis of the di/dt data in frequency domain can be used to detect abnormalities in the wiring 108 and the connections in the current loop at a higher resolution than when the data is analyzed in time domain.

Figure 6:
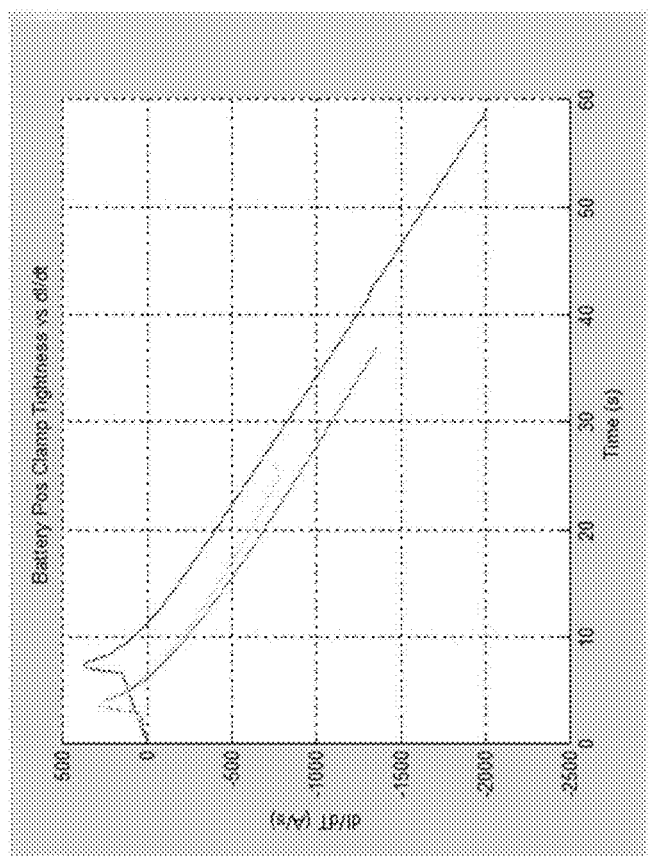
FIG. 6 shows a graph of rate of change of current (di/dt) data versus time.

FIG. 6 shows an example of an analysis of di/dt data in time domain. For example, the graph shows curves of di/dt data measured at a clamp of a positive terminal of the battery 102. Each curve represents di/dt data measured at a different amount of tightness of the clamp. As seen, the change in the di/dt data in time domain with different amount of tightness of the clamp is insufficient to conclude if the clamp is tight, overtight, or loose. No discernable change can be identified over the noise floor when measuring voltage, current, or power in time domain.

Figure 7:
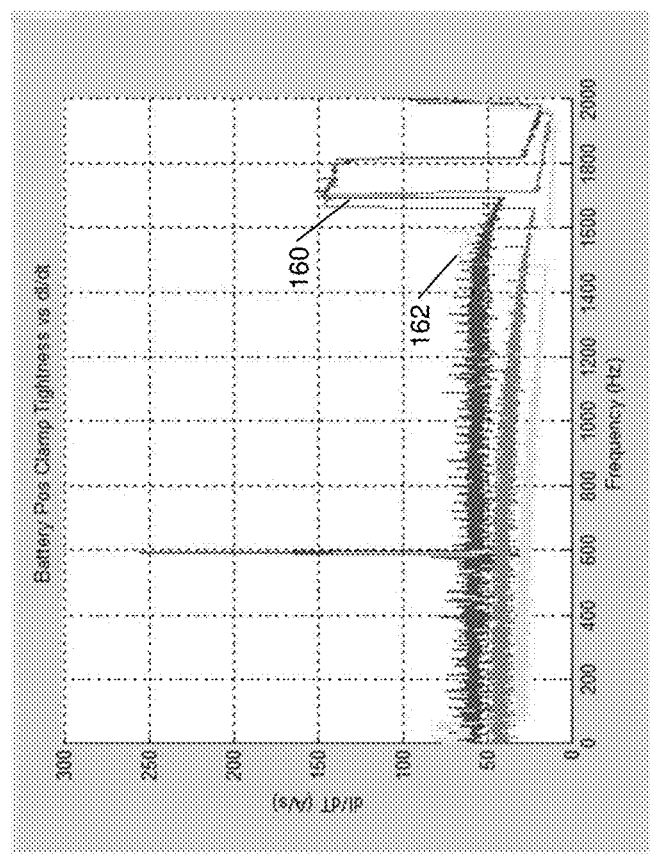
FIG. 7 shows a graph of rate of change of current (di/dt) data versus frequency.

FIG. 7 shows an example of an analysis of di/dt data in frequency domain. For example, the graph shows di/dt data sampled at a clamp of a positive terminal of the battery 102. As seen, the di/dt rate decreases measurably from 160 to 162 as the nut at the clamp is loosened. Further, if the sampling rate is increased, the resolution of detecting a loose nut increases.

A change in rise time of a current or voltage signal provides a more discernable change than a measurement of current, voltage or resistance. For example, a two-fold change in the rise time can be seen with a 1 milli-Ohm change in resistance. Accordingly, the di/dt analysis in frequency domain is not only more robust due to low noise sensitivity but is also scalable since the resolution scales with sampling frequency.

The following are various methods employed by the prognostics system 100 generally and the controller 104 specifically for performing all of the operations described above. In the following description, the term control generally denotes operations performed by the controller 104.

Figure 8:
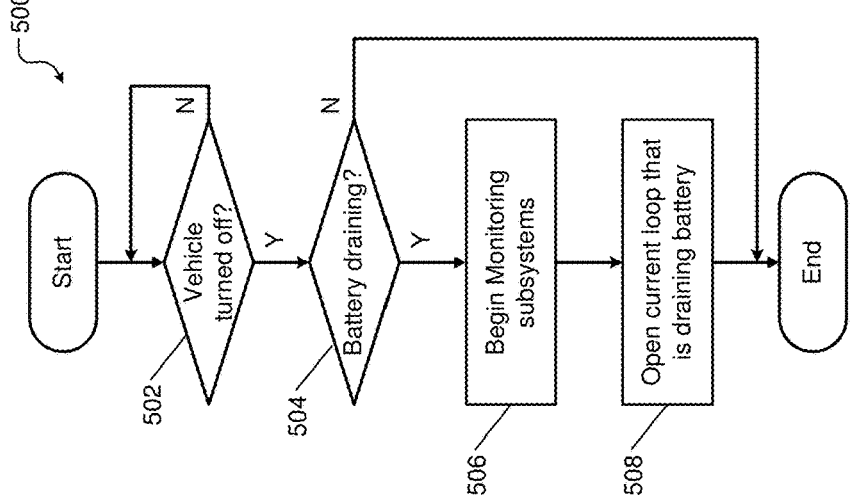
FIG. 8 shows a flowchart of a method performed by the wiring prognostics system to identify and isolate a current loop that drains the battery of the vehicle.

FIG. 8 shows a method 500 for detecting and disabling a current loop that drains the battery of the vehicle (e.g., the battery 102 of the vehicle 101 shown in FIG. 1) while the vehicle is turned off. The method 500 is shown and described in more detail with reference to FIGS. 15 and 16. At 502, control determines if the vehicle is turned off. If the vehicle is turned off, at 504, control detects using the prognostics system 100 shown in FIG. 1 if the battery of the vehicle is draining.

If the battery of the vehicle is draining, at 506, control begins monitoring current loops in the vehicle. At 508, control detects a current loop that is draining the battery (e.g., due to a problem with one or more wires are connections in the current loop) by performing the measurements and analysis in frequency domain as described above. Based on the analysis, control opens the current loop (e.g., by disconnecting a subsystem 106 in the current loop using a corresponding switch 130 shown in FIG. 1).

The method 500 may inform the vehicle owner of the problem (e.g., by sending a message to a mobile device of the owner or by displaying a message on the dashboard of the vehicle when the vehicle owner starts the vehicle). Optionally, after warning the vehicle owner about the problem and to schedule service, the method 500 may reconnect the disconnected subsystem (e.g., by using a corresponding switch) when the vehicle owner starts the vehicle.

Figure 9:
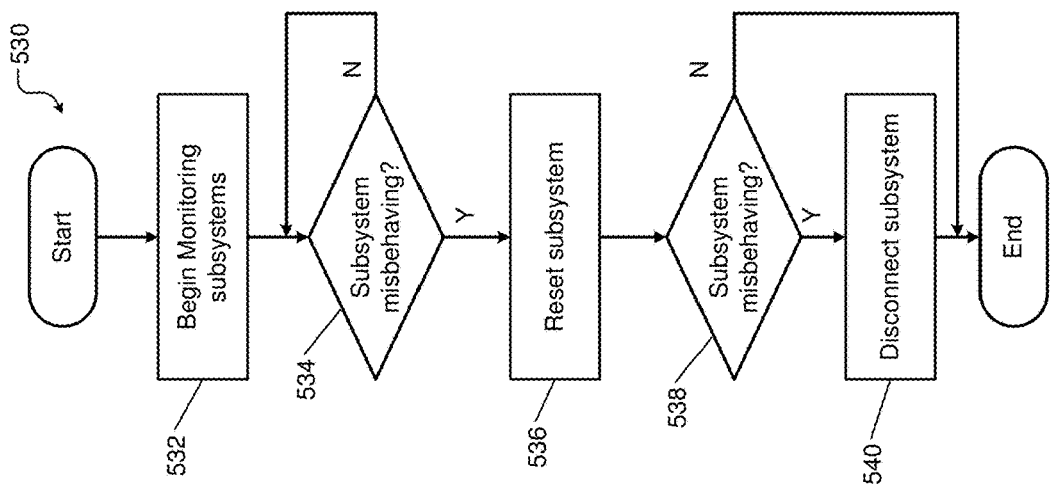
FIG. 9 shows a flowchart of a method performed by the wiring prognostics system to identify and isolate a misbehaving subsystem (e.g., not responding, having communication issues, etc.) in the vehicle.

FIG. 9 shows a method 530 for resetting a misbehaving subsystem (e.g., a subsystem 106 that is not responding, having communication issues, etc.) in the vehicle. At 532, control begins monitoring the subsystems in the vehicle (e.g., the subsystems 106 in the vehicle 101 shown in FIG. 1). At 534, control determines if any of the subsystems in the vehicle is misbehaving (e.g., not responding, having communication issues, etc.). If any of the subsystems is misbehaving, at 536, control resets the misbehaving subsystem.

For example, control may initially simply restart (i.e., initialize or reboot) the misbehaving subsystem. If that does not solve the problem, control may perform a hardware reset on the misbehaving subsystem by disconnecting power to the misbehaving subsystem and after waiting for a period of time reconnecting the power to the misbehaving system (e.g., by using a corresponding switch 130).

After performing either type of reset on the misbehaving subsystem, at 538, control again determines if the subsystem is still misbehaving. If the subsystem is still misbehaving, at 540, control disconnects the misbehaving subsystem (e.g., by using a corresponding switch 130) and informs the vehicle owner to schedule service. Control disconnects the misbehaving subsystem if the misbehaving subsystem is not a safety subsystem (i.e., not controlling one or more safety features of the vehicle). Control follows a different procedure shown and described below with reference to FIG. 10 if the misbehaving subsystem is a safety subsystem.

Figure 10:
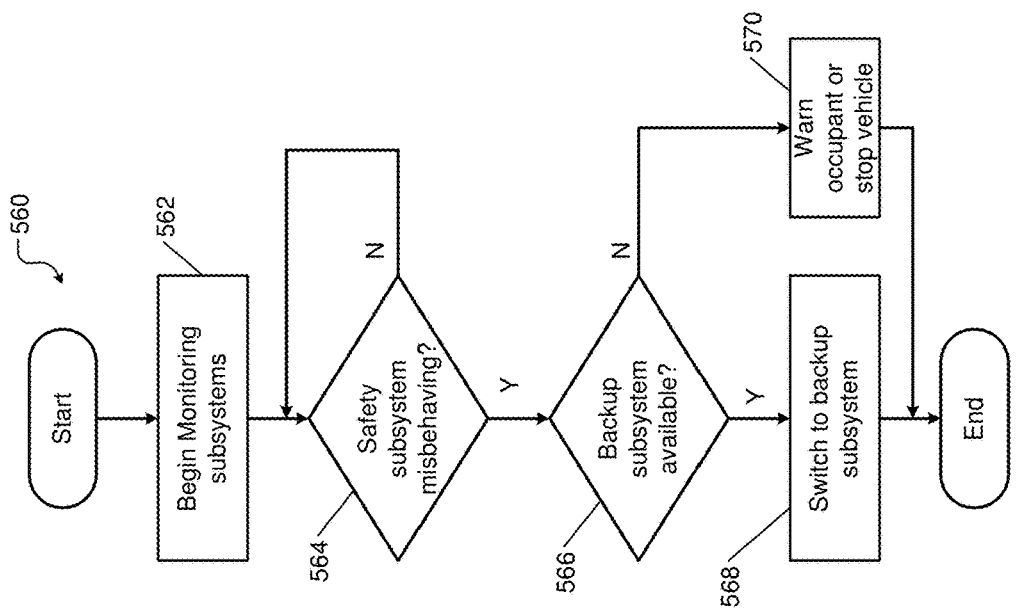
FIG. 10 shows a flowchart of a method performed by the wiring prognostics system for identifying and isolating a misbehaving safety subsystem of the vehicle and switching to a backup safety subsystem in the vehicle.

FIG. 10 shows a method 560 for switching to a backup subsystem (e.g., one of the subsystems 107 shown in FIGS. 2 and 3) when a safety subsystem (e.g., one of the subsystems 106 shown in FIG. 1) in the vehicle is misbehaving (e.g., not responding, having communication issues, etc.). At 562, control begins monitoring the subsystems in the vehicle (e.g., the subsystems 106 in the vehicle 101 shown in FIG. 1). At 564, control determines if any of the safety subsystems in the vehicle is misbehaving (e.g., not responding, having communication issues, etc.) by performing the measurements and analysis in frequency domain as described above.

If any of the safety subsystems is misbehaving, at 566, control determines if a backup subsystem for the misbehaving safety subsystem is available and operational. If a backup subsystem is available and operational, at 568, control switches over to the back of subsystem (e.g., by disconnecting the misbehaving subsystem and connecting the backup subsystem instead using the switches 130, 132 shown in FIGS. 2 and 3). If a backup subsystem is unavailable, at 570, control informs the vehicle owner and optionally stops the vehicle depending on the severity of the problem with the safety subsystem.

Figure 11:
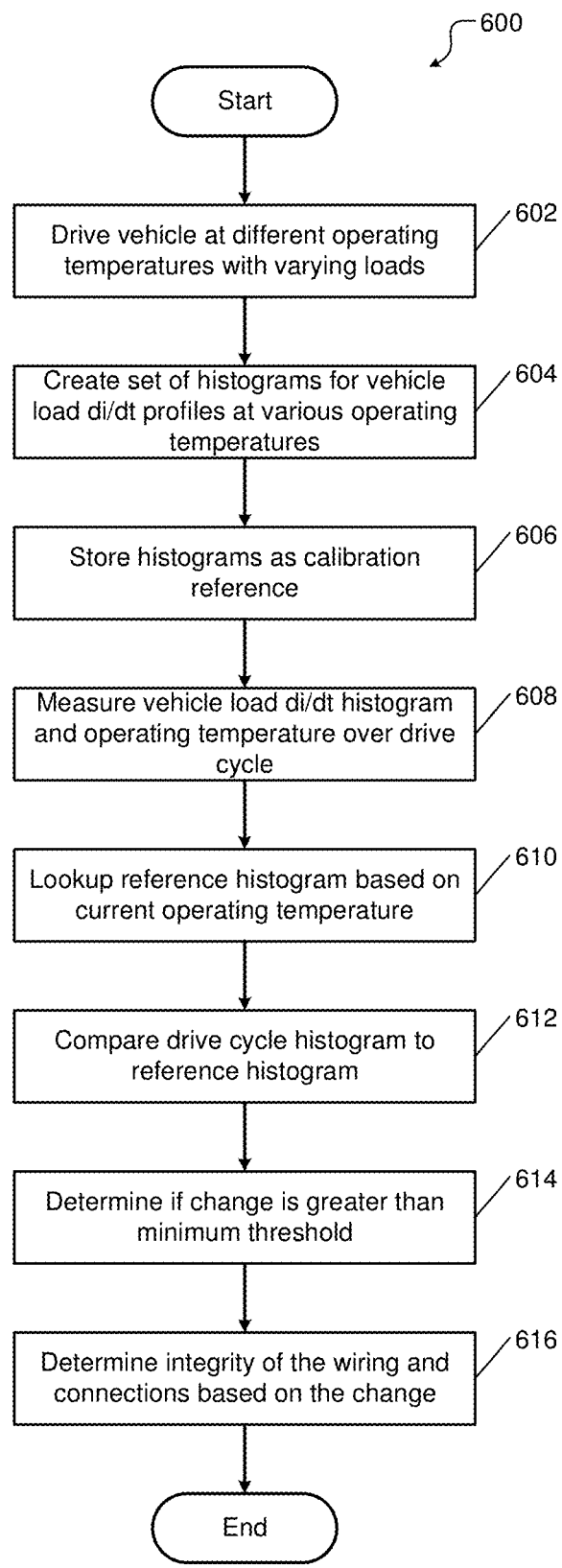
FIG. 11 shows a flowchart of a method for calibrating the wiring prognostics system.

FIG. 11 shows a method 600 for calibrating the prognostics system 100 shown in FIG. 1. At 602, the method 600 includes driving the vehicle at different operating temperatures with varying loads. At 604, control creates a set of histograms of rate of change of current characteristics measured at different operating temperatures for the plurality of subsystems. At 606, control stores the histograms as calibration reference.

At 608, during normal operation, control generates a histogram of the rate of change of current characteristic measured at an operating temperature over a drive cycle for one of the subsystems. At 610, control looks up a reference histogram from the stored histograms for the one of the subsystems based on the operating temperature during the drive cycle.

At 612, control compares the histogram of the rate of change of current characteristic measured at the operating temperature during the drive cycle to the reference histogram. At 614, control determines a difference between the reference histograms and the histogram of the rate of change of current characteristic measured at the operating temperature during the drive cycle. Control determines if the difference is greater than or equal to a predetermined threshold. The predetermined threshold is determined as shown and described below with reference to FIG. 12.

At 616, control determines the integrity of the wiring and connections associate with the one of the subsystem based on the difference, and generates an indication regarding the integrity of the plurality of the wires and the connections associated with the one of the subsystems (e.g., if the wiring and the connections are normal or abnormal) based on whether the difference being greater than or equal to the predetermined threshold. Control may also indicate a type of abnormality (e.g., short circuit, open circuit, overheating, etc.) based on the difference.

Figure 12:
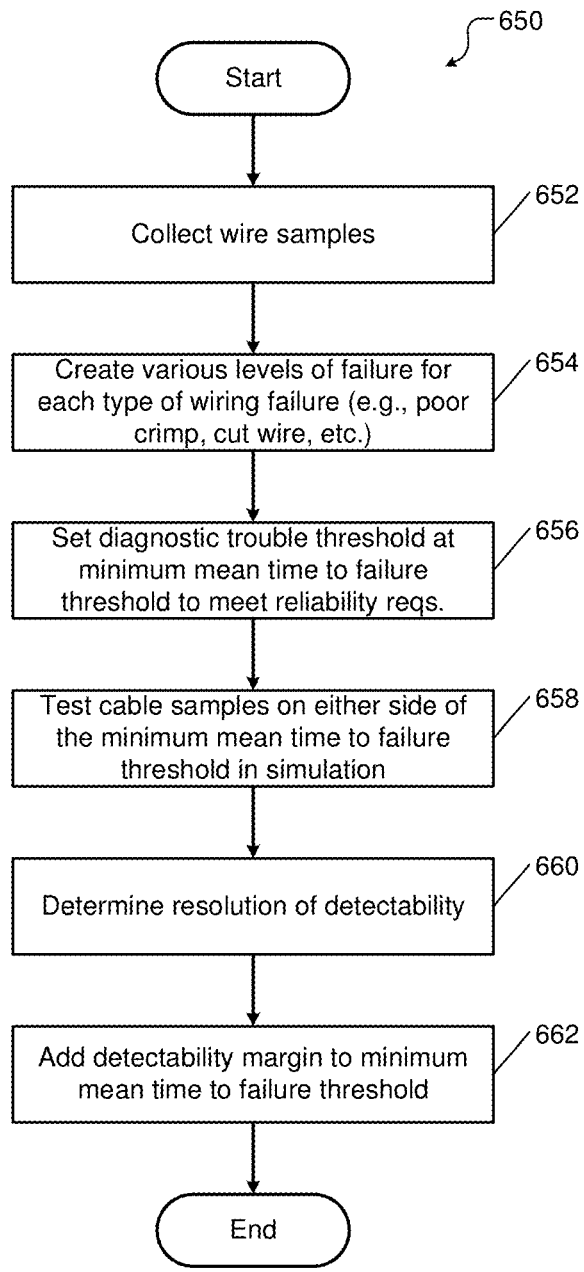
FIG. 12 shows a flowchart of a method for empirically determining a threshold used by the wiring prognostics system.

FIG. 12 shows a method 650 for determining the threshold used in the method 600. At 652, the method 650 includes collecting wire samples. At 654, the method 650 includes creating various levels of failure for each type of wiring failure (e.g., poor crimp, cut layer, etc.). For example, the failures may include defects such as those shown at 109-1, 109-2, and 109-3 in FIG. 5.

At 656, control sets a diagnostic trouble threshold at a minimum mean time to failure threshold to meet reliability requirements. At 658, control tests the wire samples on either side of the minimum mean time to failure threshold in simulation. At 660, control determines the resolution of fault detectability. At 662, control adds the detectability margin to the minimum mean time to failure threshold. This threshold is then used in the method 600 to determine the integrity of wiring and connections as described above with reference to FIG. 11.

Figure 13:
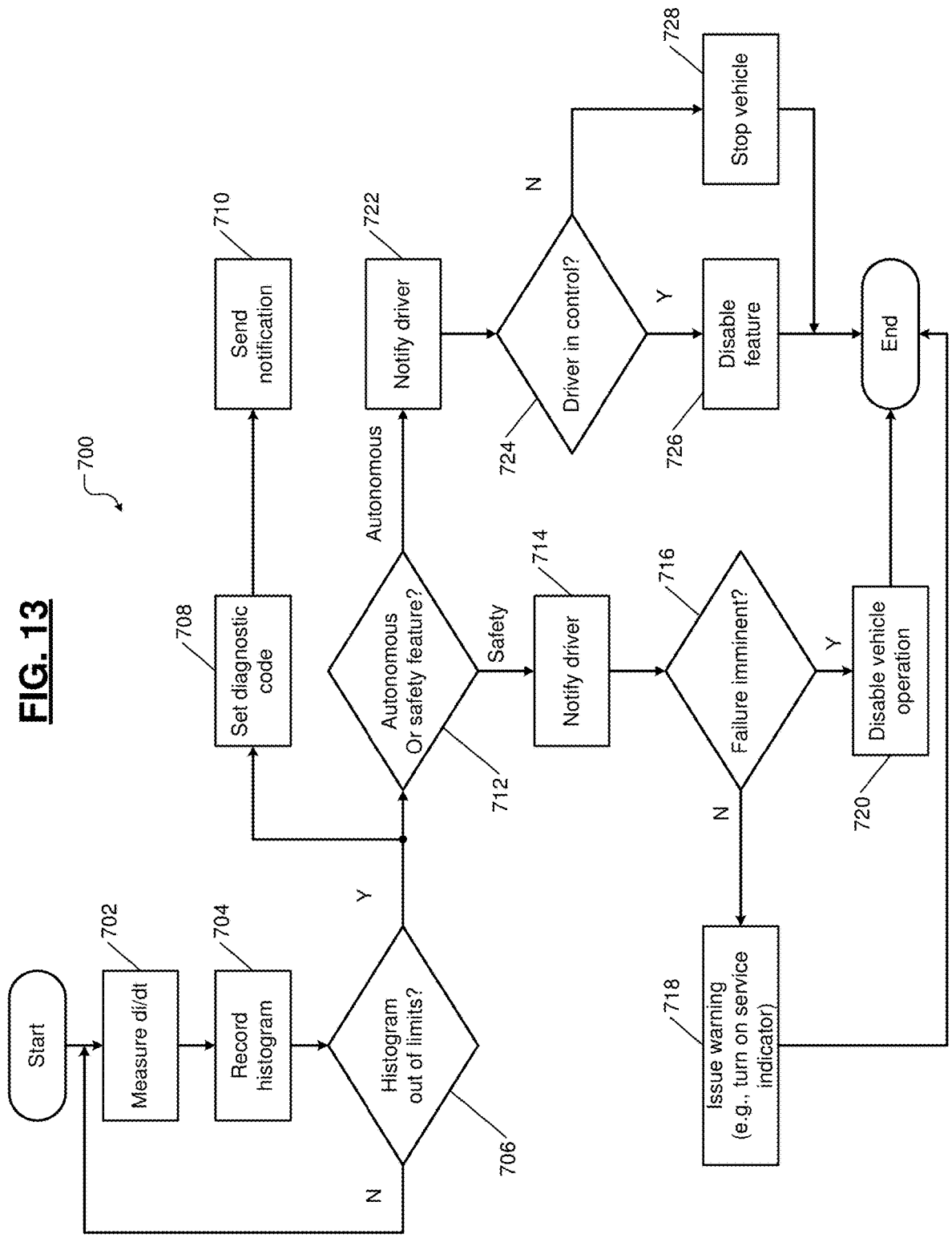
FIG. 13 shows a flowchart of a first method performed by the wiring prognostics system to handle a failure of a wire and/or a connection in a current loop including a subsystem controlling a safety feature of the vehicle.

FIG. 13 shows a first method 700 for handling a failure of a wire and/or a connection in a current loop including a subsystem controlling a safety feature of the vehicle. At 702, control measures a rate of change of current characteristic in frequency domain for a current loop including a switch, a subsystem controlling a safety feature of the vehicle, and a plurality of wires connecting the subsystem to a battery of the vehicle via the switch (e.g., elements 130, 108, 106, and 102) shown in FIG. 1).

At 704, control creates a histogram of the rate of change of current characteristic by performing the measurements and analysis in frequency domain as described above. At 706, control determines if the histogram is out of limits (e.g., if the difference between the histogram and a reference histogram generated during calibration is greater than or equal to a predetermined threshold). Control returns to 702 if the histogram is not out of limits. If the histogram is out of limits, control sets a diagnostic code at 708 and sends a notification to the vehicle owner at 710 (e.g., to schedule service).

Additionally, if the histogram is out of limits, at 712, control determines if the detected abnormality (indicated by the histogram being out of limits) relates to a safety feature or a feature associated with autonomous driving. If the detected abnormality is related to a safety feature and not associated with autonomous driving, then at 714, control notifies the driver of the vehicle.

At 716, control determines if a failure due to the detected abnormality is imminent. If a failure due to the detected abnormality is not imminent, at 718, control issues a warning to the driver of the vehicle (e.g., turns on a service indicator). If a failure due to the detected abnormality is imminent, at 720, control disables the vehicle operation.

If the detected abnormality is not related to a safety feature and is associated with autonomous driving, then at 722, control notifies the driver of the vehicle. At 724, control determines if the driver is controlling the vehicle (e.g., if the vehicle is in semi-autonomous mode). If the driver is controlling the vehicle, at 726, control disables the feature. If the driver is not controlling the vehicle (i.e., if the vehicle is in autonomous mode), then at 728 control stops the vehicle.

Figure 14:
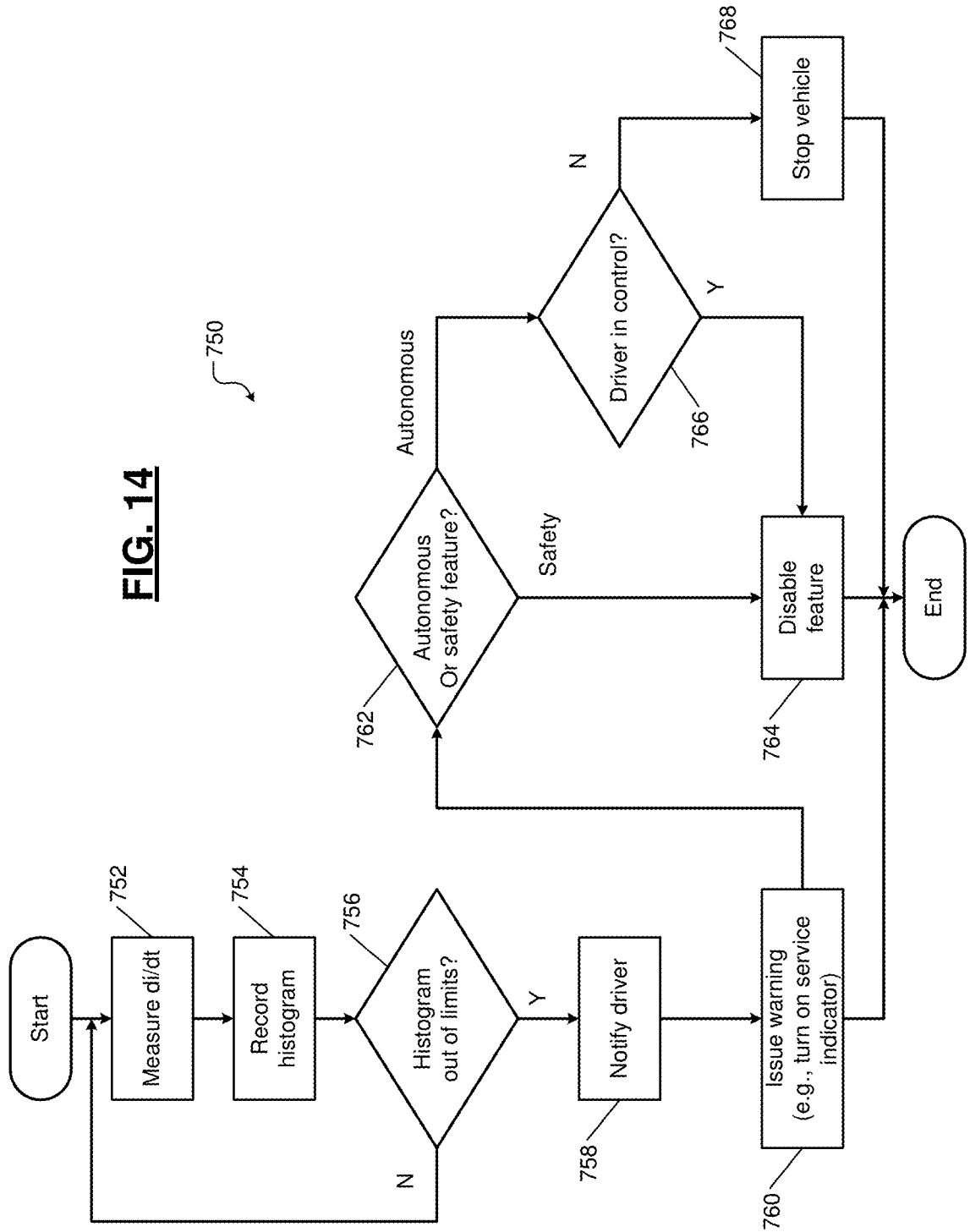
FIG. 14 shows a flowchart of a second method performed by the wiring prognostics system to handle a failure of a wire and/or a connection in a current loop including a subsystem controlling a safety feature of the vehicle.

FIG. 14 shows a second method 750 for handling a failure of a wire and/or a connection in a current loop including a subsystem controlling a safety feature of the vehicle. At 752, control measures a rate of change of current characteristic in frequency domain for a current loop including a switch, a subsystem controlling a safety feature of the vehicle, and a plurality of wires connecting the subsystem to a battery of the vehicle via the switch (e.g., elements 130, 108, 106, and 102) shown in FIG. 1).

At 754, control creates a histogram of the rate of change of current characteristic by performing the measurements and analysis in frequency domain as described above. At 756, control determines if the histogram is out of limits (e.g., if the difference between the histogram and a reference histogram generated during calibration is greater than or equal to a predetermined threshold). Control returns to 752 if the histogram is not out of limits. If the histogram is out of limits, control notifies the driver at 758 (e.g., to schedule service). At 760, control issues a warning to the driver of the vehicle (e.g., turns on a service indicator).

At 762, control determines if the detected abnormality (indicated by the histogram being out of limits) relates to a safety feature or a feature associated with autonomous driving. If the detected abnormality is related to a safety feature and not associated with autonomous driving, then at 764, control disables the feature.

If the detected abnormality is not related to a safety feature and is associated with autonomous driving, then at 766, control determines if the driver is controlling the vehicle (e.g., if the vehicle is in semi-autonomous mode). If the driver is controlling the vehicle, then at 764, control disables the feature. If the driver is not controlling the vehicle (i.e., if the vehicle is in autonomous mode), then at 768 control stops the vehicle.

Figure 15:
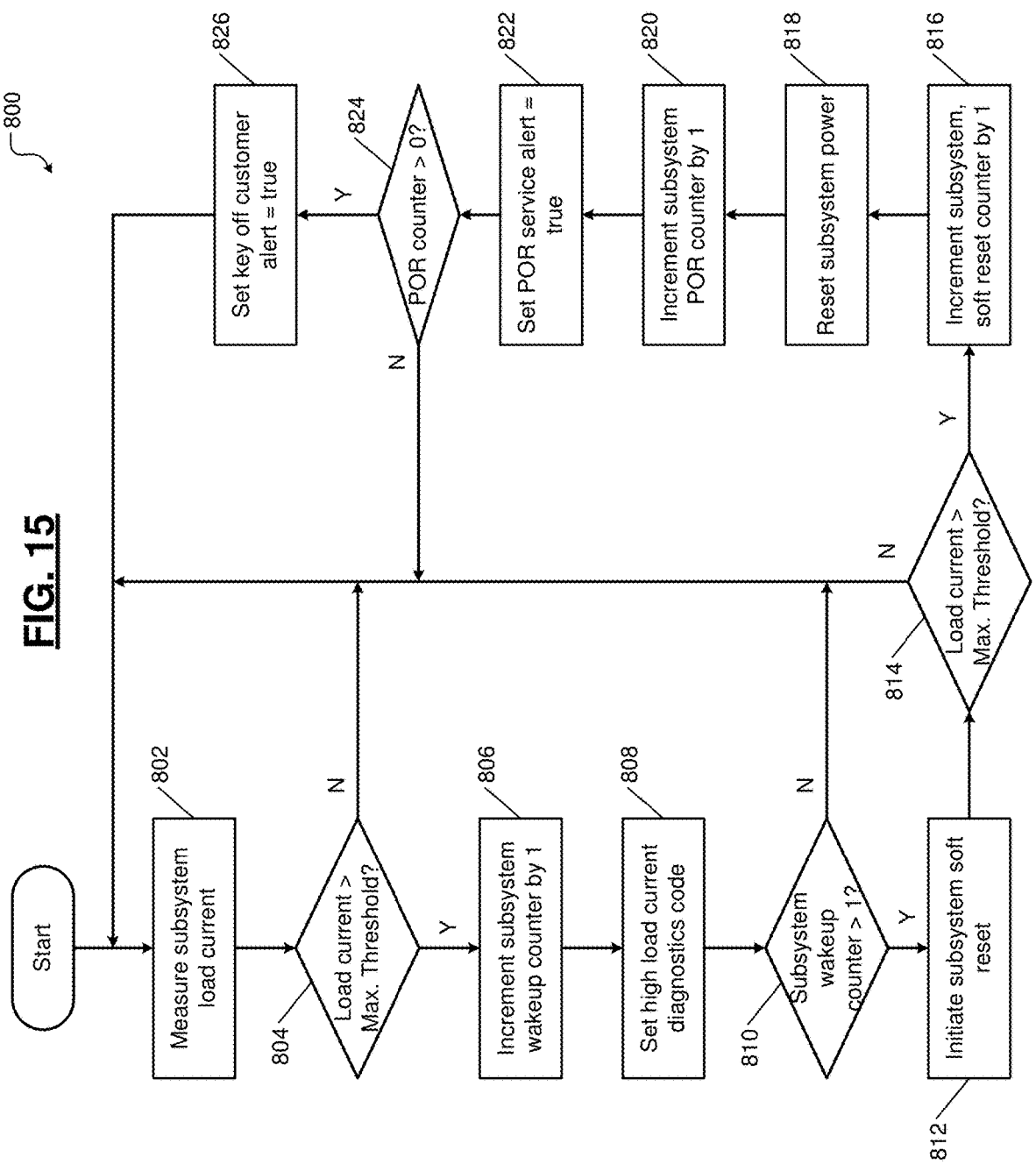
FIG. 15 shows a flowchart of a method performed by the wiring prognostics system to detect and disable a current loop that is draining the battery of the vehicle when the vehicle is turned off.

FIG. 15 shows a method 800 to detect and disable a current loop that is draining the battery of the vehicle when the vehicle is turned off. At 802, control measures a load current of a subsystem in a current loop. At 804, control determines if the load current is greater than or equal to a maximum threshold. Control returns to 802 if the load current is less than the maximum threshold.

If the load current is greater than or equal to the maximum threshold, at 806 control increments a first counter by 1. The first counter helps define a number of times the following operations can be attempted before notifying the vehicle owner. At 808, control sets a diagnostic code indicating that the load current is high (i.e., greater than or equal to the maximum threshold).

At 810, control determines if the first counter is greater than 1. Control returns to 802 if the first counter is not greater than 1. If the first counter is greater than 1, at 812, control initiates a soft reset for the subsystem (i.e., control does not disconnect and reconnect power to the subsystem). At 814, after the soft reset, control determines if the load current is greater than or equal to the maximum threshold. Control returns to 802 if the load current is less than the maximum threshold.

If the load current is still greater than or equal to the maximum threshold even after the soft reset, at 816, control increments a second counter by 1. At 818, control resets power to the subsystem (this is the hardware reset described above). At 820, control increments a third counter by 1. At 822, control sets the power on reset (POR) service alert as true.

At 824, control determines if the third counter is greater than zero. Control returns to 802 if the third counter is not greater than zero. If the third counter is greater than zero, at 826, control sets the key off customer alert as true. Control returns to 802.

The method 800 assumes that the vehicle is in key off (i.e., turned off) at the beginning. If the issue is not resolved by the hard reset, the method 800 notifies the customer (e.g., via a diagnostic code, a phone app, an engine light, etc.) that the vehicle needs to be serviced. The method 800 may also notify the customer at the time of the event. The method 800 can also be used during vehicle operation. However, during vehicle operation, the method 800 may not wait for key on or key off to notify the driver.

Figure 16:
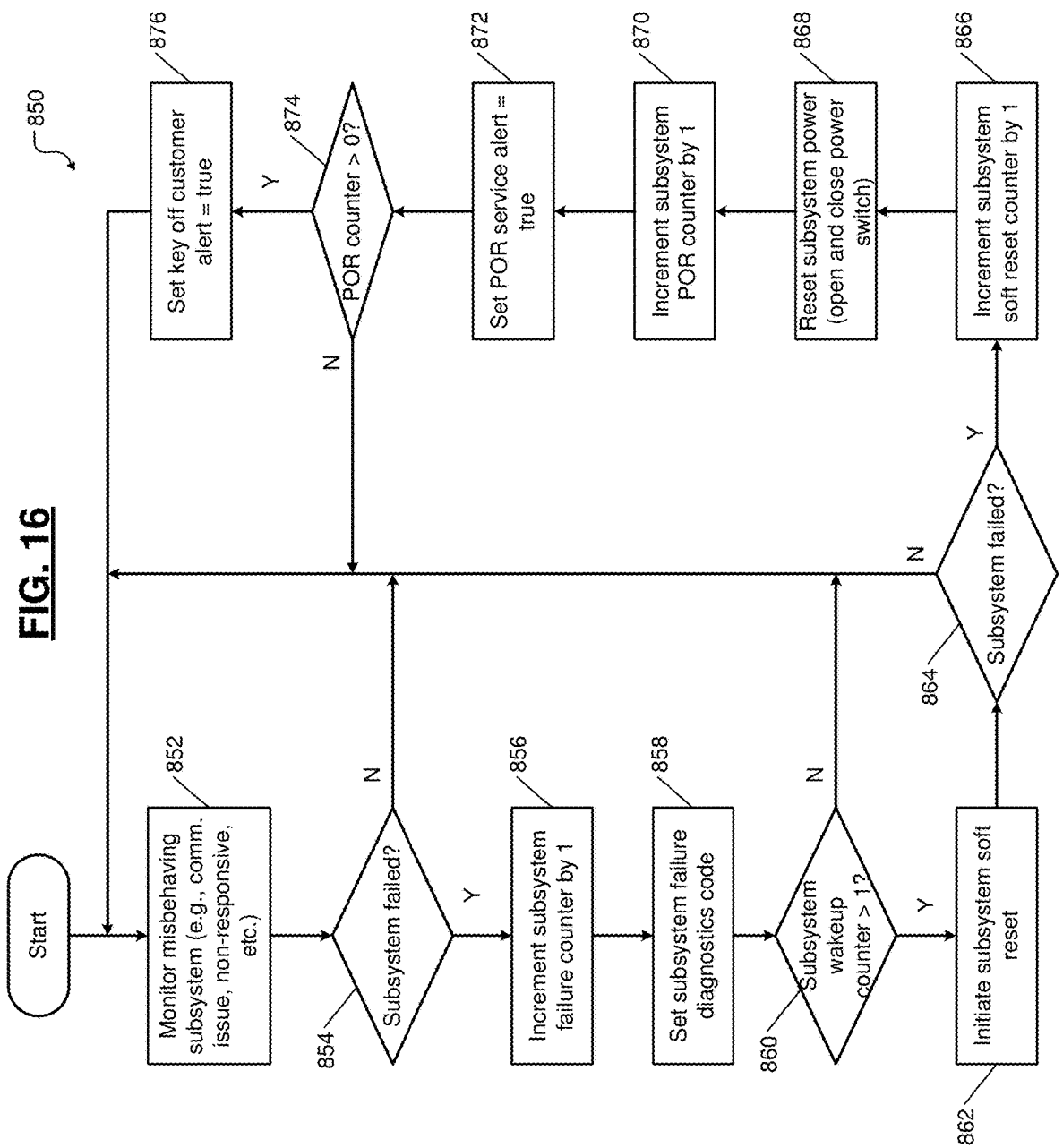
FIG. 16 shows a flowchart of a method performed by the wiring prognostics system to detect and isolate a misbehaving subsystem in a vehicle while the vehicle is turned off.

FIG. 16 shows a method 850 to detect and isolate a misbehaving subsystem while the vehicle is turned off. The method 850 is similar to the method 800 shown and described above with reference to FIG. 15. The method 850 can be performed with the vehicle turned off (i.e., with key off) or during vehicle operation (i.e., with key on). When the method 850 is performed with the vehicle turned off (i.e., with key off), the customer notification described below can be performed at any time although the customer notification may be performed after key on (i.e., after the vehicle is turned on) to save battery power.

At 852, control monitors a misbehaving subsystem. For example, the subsystem may be nonresponsive, may have a communication issue, and so on. At 854, control determines based on the monitoring if the subsystem has failed. Control returns to 852 if the subsystem has not failed. If the subsystem has failed, at 856, control increments a first counter by 1. At 858, control sets a diagnostic code to indicate that the subsystem has failed.

At 860, control determines if the first counter is greater than 1. Control returns to 852 if the first counter is not greater than 1. If the first counter is greater than 1, at 862, control initiates a soft reset for the subsystem (i.e., control does not disconnect and reconnect power to the subsystem). At 864, after the soft reset, control determines if the subsystem has failed. Control returns to 852 if the subsystem has not failed.

If the subsystem has failed after the soft reset, at 866, control increments a second counter by 1. At 868, control resets power to the subsystem by opening and subsequently closing the switch that connects power to the subsystem. At 870, control increments a third counter by 1. At 872, control sets the power on reset (POR) service alert as true.

At 874, control determines if the third counter is greater than zero. Control returns to 852 if the third counter is not greater than zero. If the third counter is greater than zero, at 876, control sets the key off customer alert as true. Control returns to 852.

Figure 17:
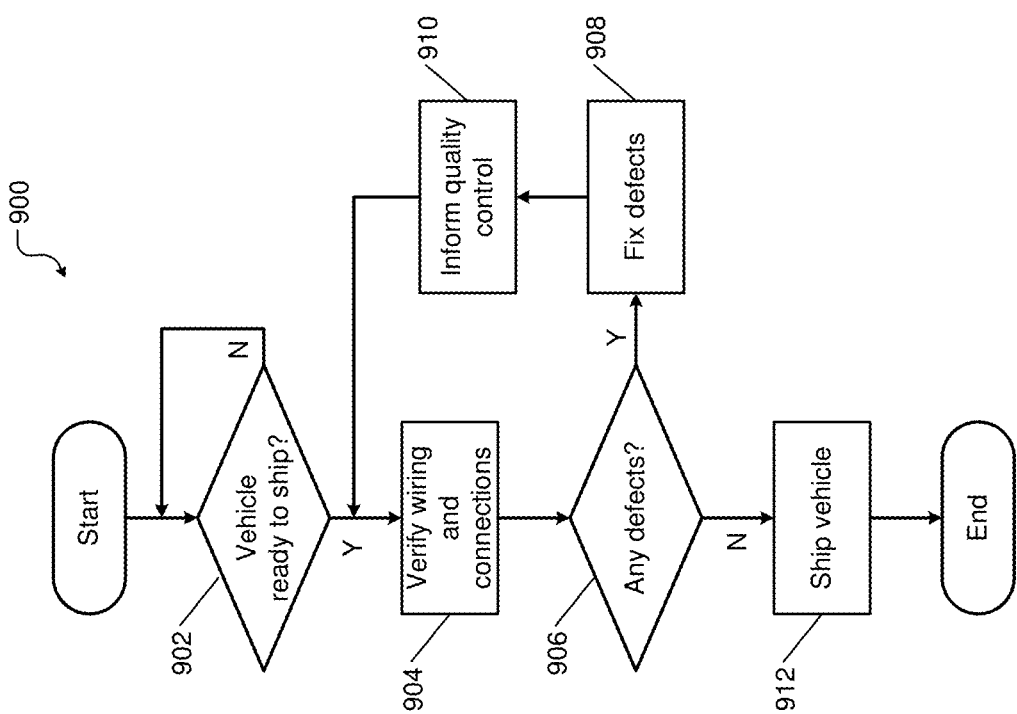
FIG. 17 shows a flowchart of a method performed by the wiring prognostics system to verify integrity of wiring and connections in a vehicle before shipping the vehicle from the factory.

FIG. 17 shows a method 900 for verifying integrity of wiring in a vehicle before shipping the vehicle from the factory. At 902, the method 900 determines if the vehicle is ready to ship from the factory. At 904, if the vehicle assembly is complete and the vehicle is ready to ship, control verifies the wiring and connections in the vehicle using the prognostics system 100 shown in FIG. 1.

At 906, control determines if any defects are found in the wiring and connections in the vehicle. If any defects are found, at 908, the method 900 includes fixing the defects. At 910, the method 900 informs quality control the details about the defects found and the steps taken to remedy the defects, including the parts used, the labor involved, the delay caused in shipping the vehicle, and so on.

The method 900 repeats steps 904, 906, 908 and, 910 until no defects are found in the wiring and connections. When no defects are found in the wiring and connections in the vehicle, the method 900 proceeds to 912. At 912, the method 900 certifies that the vehicle is ready to ship from the factory.

Figure 18:
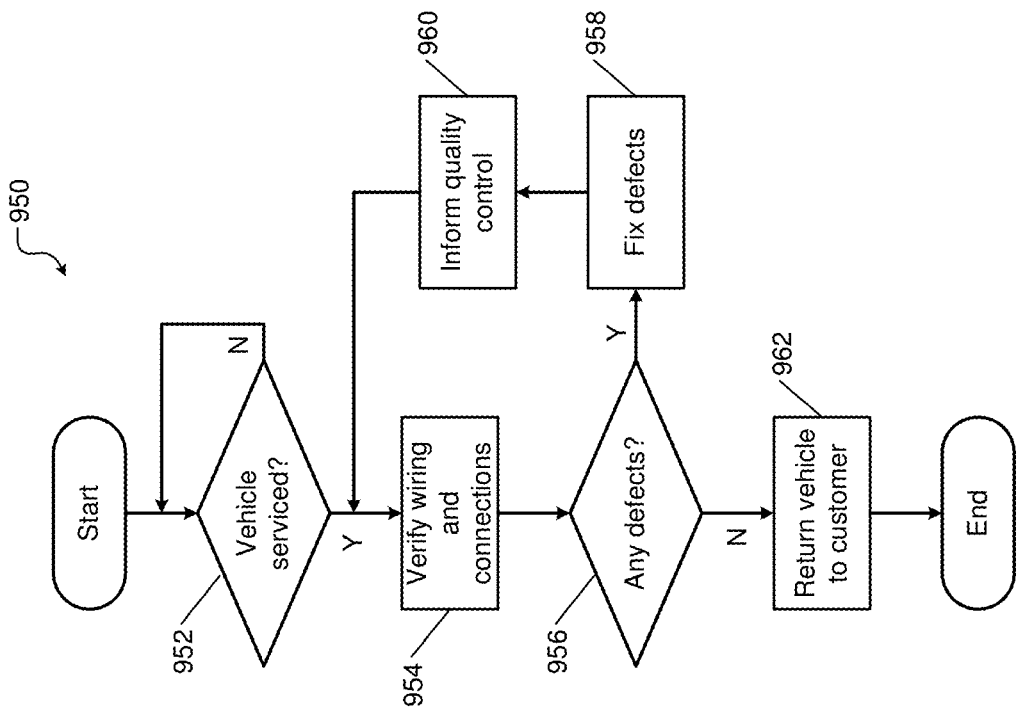
FIG. 18 shows a flowchart of a method performed by the wiring prognostics system to verify integrity of wiring and connections in a vehicle after servicing the vehicle at a service center before returning the vehicle to the customer.

FIG. 18 shows a method 950 for verifying integrity of wiring in a vehicle after servicing the vehicle at a service center before returning the vehicle to the customer. At 952, the method 950 determines if the vehicle service is completed. At 954, if the vehicle service is completed, control verifies the wiring and connections in the vehicle using the prognostics system 100 shown in FIG. 1.

At 956, control determines if any defects are found in the wiring and connections in the vehicle. If any defects are found, at 958, the method 950 includes fixing the defects. At 960, the method 950 informs quality control the details about the defects found and the steps taken to remedy the defects, including the parts used, the labor involved, the delay caused in returning the vehicle to the customer, and so on.

The method 950 repeats steps 954, 956, 958 and, 960 until no defects are found in the wiring and connections in the vehicle. When no defects are found in the wiring and connections in the vehicle, the method 950 proceeds to 962. At 962, the method 950 certifies that the vehicle is ready to be returned to the customer.

The teachings of the present disclosure are applicable to non-autonomous, semi-autonomous, and autonomous vehicles. Further, the teachings are also applicable to any other type of vehicle such as ships and aircrafts that involve multiple subsystems interconnected by extensive wiring. Further, the teaching are also applicable to electrical systems employing a backplane in which multiple subsystems are installed. Although a backplane uses printed circuit boards that include conductive traces, which reduces the amount of wires used in the electrical systems, the conductive traces can have integrity issues including short circuits, open circuits, and defective connections to circuit boards and power supplies connected to the backplane. These issues can be detected using the teachings of the present disclosure. Other applications of the teachings are contemplated.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A system for a vehicle comprising:
    a battery of the vehicle;
    a plurality of switches connected to the battery;
    a plurality of subsystems of the vehicle connected to the battery via the switches and wires; and
    a controller configured to:
        control the switches and the subsystems;
        identify a variation in a rate of change of current characteristic in frequency domain for a current loop including one of the switches, one of the subsystems, and a plurality of the wires;
        generate a histogram of the rate of change of current characteristic at an operating temperature for the one of the subsystems; and
        determine integrity of the plurality of the wires and connections of the wires in the current loop based on a comparison between the histogram and one or more histograms of rate of change of current characteristics measured at different operating temperatures for the plurality of subsystems.

2. The system of claim 1 wherein the controller generates an indication regarding the integrity of the plurality of the wires and connections of the wires in the current loop in response to the integrity being less than or equal to a first threshold.

3. The system of claim 1 wherein the controller generates an indication regarding the integrity of the plurality of the wires and connections of the wires in the current loop in response to the integrity being less than or equal to a first threshold, and disconnects the one of the subsystems from the current loop by controlling the one of the switches in response to the integrity being less than or equal to a second threshold that is greater than the first threshold.

4. The system of claim 1 wherein the controller characterizes operation of the one of the subsystems based on the variation in the rate of change of current characteristic for the current loop and determines based on the characterization whether to disconnect the one of the subsystems from the current loop by controlling the one of the switches.

5. The system of claim 1 wherein the controller characterizes operation of the one of the subsystems based on the variation in the rate of change of current characteristic for the current loop, and based on the characterization controls the one of the switches to disconnect the one of the subsystems from the current loop and subsequently reconnect the one of the subsystems to the current loop.

6. The system of claim 5 wherein the controller characterizes the operation of the one of the subsystems and disconnects the one of the subsystems based on the characterization when the vehicle is turned off.

7. The system of claim 1 wherein based on the variation in the rate of change of current characteristic for the current loop, the controller disconnects the one of the subsystems from the current loop and activates a backup subsystem powered by the battery.

8. The system of claim 1 wherein based on the variation in the rate of change of current characteristic for the current loop, the controller disconnects the one of the subsystems from the current loop and activates a backup subsystem powered by a different battery.

9. The system of claim 1 wherein the controller determines the integrity of the plurality of the wires and connections of the wires additionally based on one or more of a voltage measurement and a temperature measurement in the current loop.

10. The system of claim 1 wherein the controller is configured to:
compare the histogram to one of the histograms corresponding to the operating temperature;
determine a difference between the histogram and the one of the histograms;
determine the integrity of the plurality of the wires and connections of the wires in the current loop based on the difference; and
generate an indication regarding the integrity of the plurality of the wires and connections of the wires in the current loop in response to the difference being greater than or equal to a predetermined threshold.

11. A method comprising:
connecting a battery to a plurality of subsystems of a vehicle via a plurality of switches and wires;
controlling the switches and the subsystems;
measuring current and analyzing, without using reflectometry, a variation in a rate of change of current characteristic in frequency domain for a current loop including one of the switches, one of the subsystems, and a plurality of the wires;
generating a histogram of the rate of change of current characteristic at an operating temperature for the one of the subsystems;
determining an integrity of the plurality of the wires and connections of the wires in the current loop based on a comparison between the histogram and one or more histograms of rate of change of current characteristics measured at different operating temperatures for the plurality of subsystems.

12. The method of claim 11 further comprising detecting at least one of a defective wire and a defective connection of one of the wires in the current loop.

13. The method of claim 11 further comprising:
generating an indication regarding the integrity of the plurality of the wires and connections of the wires in the current loop in response to the integrity being less than or equal to a first threshold; and
disconnecting the one of the subsystems from the current loop by controlling the one of the switches in response to the integrity being less than or equal to a second threshold that is greater than the first threshold.

14. The method of claim 11 further comprising:
characterizing operation of the one of the subsystems based on the variation in the rate of change of current characteristic for the current loop; and
determining based on the characterization whether to disconnect the one of the subsystems from the current loop by controlling the one of the switches.

15. The method of claim 11 further comprising:
characterizing operation of the one of the subsystems based on the variation in the rate of change of current characteristic for the current loop; and
based on the characterization, controlling the one of the switches to disconnect the one of the subsystems from the current loop and subsequently reconnect the one of the subsystems to the current loop.

16. The method of claim 15 further comprising:
characterizing the operation of the one of the subsystems when the vehicle is turned off; and
disconnecting the one of the subsystems based on the characterization when the vehicle is turned off.

17. The method of claim 11 further comprising based on the variation in the rate of change of current characteristic for the current loop:
disconnecting the one of the subsystems from the current loop; and
activating a backup subsystem powered by the battery.

18. The method of claim 11 further comprising based on the variation in the rate of change of current characteristic for the current loop:
disconnecting the one of the subsystems from the current loop; and
activating a backup subsystem powered by a different battery.

19. The method of claim 11 further comprising determining the integrity of the plurality of the wires and connections of the wires additionally based on one or more of a voltage measurement and a temperature measurement in the current loop.

20. The method of claim 11 further comprising:
comparing the histogram to one of the histograms corresponding to the operating temperature;
determining a difference between the histogram and the one of the histograms;
determining the integrity of the plurality of the wires and connections of the wires in the current loop based on the difference; and
generating an indication regarding the integrity of the plurality of the wires and connections of the wires in the current loop in response to the difference being greater than or equal to a predetermined threshold.

* * * * *